United States Patent
Jagannathan et al.

(10) Patent No.: US 8,829,572 B2
(45) Date of Patent: Sep. 9, 2014

(54) STRUCTURE AND LAYOUT OF A FET PRIME CELL

(75) Inventors: Basanth Jagannathan, Beacon, NY (US); John J. Pekarik, Underhill, VT (US); Christopher M. Schnabel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 13/398,408

(22) Filed: Feb. 16, 2012

(65) Prior Publication Data

US 2012/0146104 A1    Jun. 14, 2012

Related U.S. Application Data

(60) Continuation of application No. 11/923,686, filed on Oct. 25, 2007, now Pat. No. 8,187,930, which is a division of application No. 10/711,640, filed on Sep. 29, 2004, now abandoned.

(51) Int. Cl.
| | |
|---|---|
| H01L 29/66 | (2006.01) |
| H01L 27/088 | (2006.01) |
| H01L 21/70 | (2006.01) |
| H01L 23/552 | (2006.01) |

(52) U.S. Cl.
USPC ........... 257/256; 257/339; 257/401; 257/659; 257/508

(58) Field of Classification Search
USPC ......... 257/256, 303, 401, 662, 355, 356, 386, 257/357, 360, 546, 369, 339, 659, 508, 335
See application file for complete search history.

(56) References Cited

U.S. PATENT DOCUMENTS

| | | | |
|---|---|---|---|
| 4,738,936 A | | 4/1988 | Rice |
| 5,573,980 A | | 11/1996 | Yoo |
| 5,635,753 A | * | 6/1997 | Hofflinger et al. ............ 257/621 |
| 6,033,984 A | | 3/2000 | Schnabel et al. |
| 6,038,168 A | | 3/2000 | Allen et al. |
| 6,097,066 A | | 8/2000 | Lee et al. |
| 6,140,171 A | | 10/2000 | Allen et al. |
| 6,477,106 B2 | | 11/2002 | Fischer et al. |
| 6,506,656 B2 | | 1/2003 | Freeman et al. |
| 6,624,030 B2 | | 9/2003 | Chang et al. |
| 6,750,119 B2 | | 6/2004 | Chu et al. |
| 7,049,669 B2 | | 5/2006 | Ma et al. |
| 8,187,930 B2 | * | 5/2012 | Jagannathan et al. ........ 438/196 |
| 2002/0132434 A1 | | 9/2002 | Freeman et al. |
| 2002/0182423 A1 | | 12/2002 | Chu et al. |
| 2003/0094130 A1 | | 5/2003 | Chu et al. |
| 2003/0197226 A1 | | 10/2003 | Chen et al. |
| 2004/0130434 A1 | | 7/2004 | Chinthakindi et al. |
| 2004/0238871 A1 | * | 12/2004 | Herzum et al. ............... 257/303 |
| 2006/0071304 A1 | | 4/2006 | Jagannathan et al. |
| 2012/0146104 A1 | * | 6/2012 | Jagannathan et al. ........ 257/256 |

* cited by examiner

*Primary Examiner* — Chuong A. Luu
(74) *Attorney, Agent, or Firm* — Joseph Abate; Roberts Mlotkowski Safran & Cole, P.C.

(57) ABSTRACT

Method of making a semiconductor device that includes forming a source and a drain in a substrate, forming a gate on the substrate between the source and drain, forming a substrate contact in electrical contact with the source, and forming an electrical contact to the source, drain and gate, and the substrate.

20 Claims, 7 Drawing Sheets

STRUCTURE AND LAYOUT OF A FET PRIME CELL

CROSS-REFERENCE TO RELATED APPLICATIONS

The present application is a continuation application of U.S. patent application Ser. No. 11/923,686, filed on Oct. 25, 2007 now U.S. Pat. No. 8,187,930, which is a divisional application of U.S. patent application Ser. No. 10/711,640, filed Sep. 29, 2004 now abandoned, the disclosures of which are expressly incorporated by reference herein in their entirety.

FIELD OF THE INVENTION

The invention relates to semiconductor circuits, and more particularly to FET (field effect transistor) circuits for microwave and RF (radio frequency) applications.

BACKGROUND OF THE INVENTION

In general, a FET is a three-terminal device which may find use in both microwave amplification and switching. The three terminals on the FET include a gate, source and drain. A basic FET includes a gallium arsenide (GaAs) substrate with an active layer arranged thereon. The active layer includes a source and a drain, with a gate arranged therebetween on top of the active layer. The FET may also include a backside metal on the bottom of the substrate. The backside metal may be configured to be in electrical communication with the source by a plated via hole through the substrate.

In operation, a voltage signal applied to the gate creates a depletion or inversion region in the active region between the source and the drain. This region allows current to flow between the source and the drain, respectively. In typical microwave and RF applications, the drain is the output of the device. FETs can be structured in the form of a FET prime cell which has better frequency and power properties then the basic FET design. The prime cell provides the gate, source, drain, substrate and wiring configuration to make an RF amplifier.

Although offering improved frequency and power characteristics, typical FET prime cell configurations include a relatively large footprint of the device due to the various features of the FET prime cell spread across the top region of the substrate. Additionally, typical FET designs include the wiring related capacitance between the gate fingers to the substrate. There is also wiring related capacitance between the source fingers and the substrate. Neither of these wiring related capacitances scale with shrinking device geometry, and thus become difficult to improve at ever smaller device sizes. These wiring related capacitances lead to a reduction in the maximum workable frequency of the device and thus imposes frequency limitation on the FET prime cell.

Figure 1:
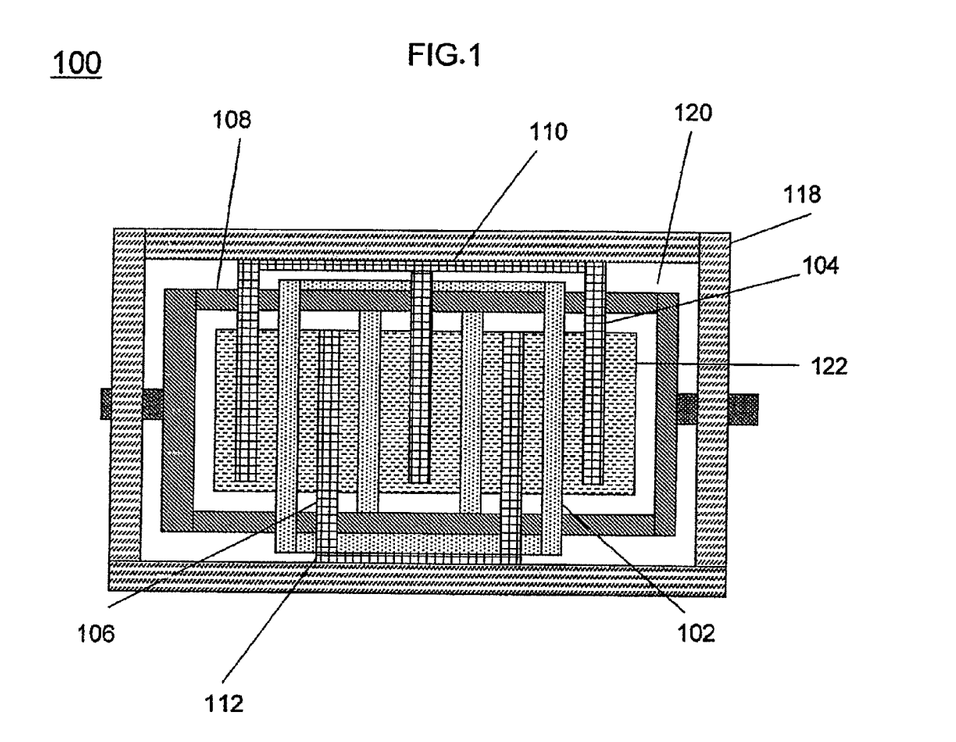
FIG. 1 is an illustration of a top view of a typical FET prime cell for microwave and RF applications.
Figure 2:
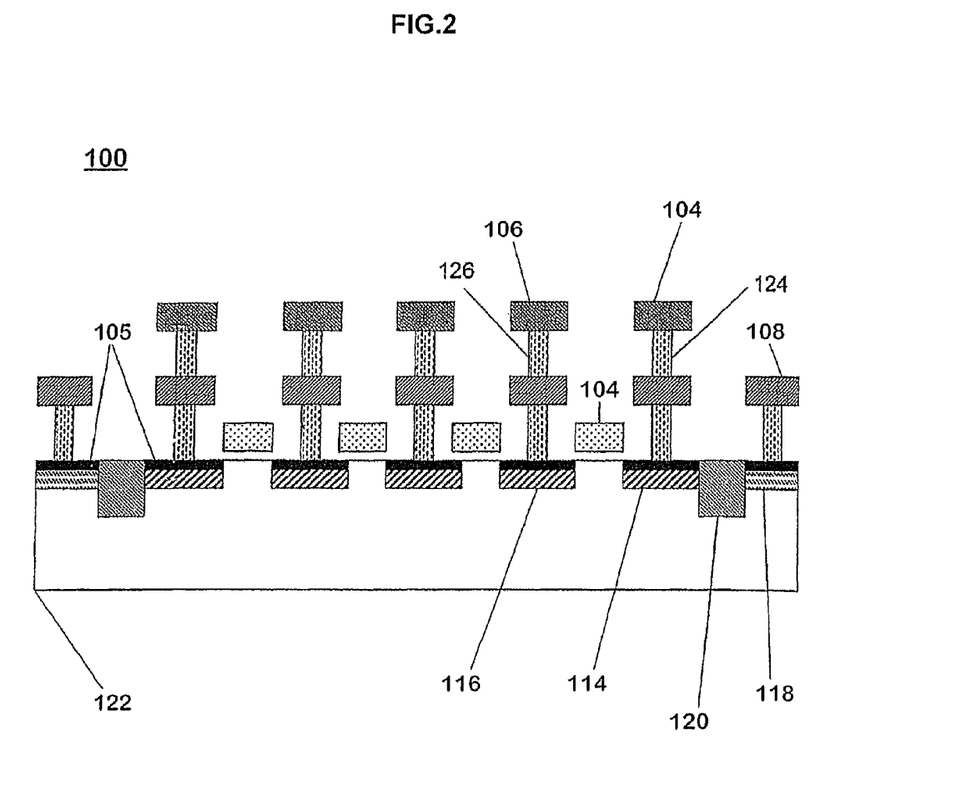
FIG. 2 is an illustration of a cross-sectional view of a typical FET prime cell for microwave and RF applications.

For example, FIGS. 1 and 2 show a typical FET prime cell 100. The FET prime cell 100 includes a substrate 122 with alternating or interleaved source contacts and drain contacts, 104 and 106, respectively, arranged thereon. Also arranged on the substrate 122 are gate fingers 102 between the source contacts and drain contacts 104 and 106. The gate fingers 102 are interconnected with one another by a metal ring 108. The metal ring 108 forms a conductive ring around the region of the substrate 122 on which the gate fingers, source contacts, and drain contacts, 102, 104 and 106, are arranged.

Arranged in the substrate 122 surrounding the active region of the FET 100 is a shallow trench isolation 120 which is surrounded by a ring substrate contact 118 (e.g., the ring substrate contact 118 is arranged adjacent and outboard of the shallow trench isolation 120). The ring substrate contact 118 provides electrical contact to substrate 122. The outer-most sources 114 have the shallow trench isolation 120 arranged on either outboard side.

Accordingly, typical FET designs also include an explicit substrate contact which leads to requiring a unique wiring of the gate. The required wiring is not optimal for device operation and adds an undesirable design constraint for circuit designers. Also, typical related art designs cause wiring parasitics which may prevent the substrate from actually being at the same potential as the source. Additionally, the combination of the shallow trench isolation adjacent the ring substrate contact may make the typical FET more susceptible to stray currents and other electrical noise.

SUMMARY OF THE INVENTION

In a first aspect of the invention, a method of making a semiconductor device includes forming a source and a drain in a substrate. The method also includes forming a gate on the substrate between the source and drain, and forming a substrate contact in electrical contact with the source. The method additionally includes forming an electrical contact between the source, drain and gate, and the substrate.

In another aspect of the invention, a semiconductor device includes a substrate and a source and a drain arranged within the substrate. The device also includes a gate formed on the substrate between the source and drain, and a substrate contact formed within the substrate adjacent the source.

In yet another aspect of the invention, a semiconductor device includes a substrate, and at least two source fingers formed in the substrate substantially parallel to one another. The device also includes at least one drain finger formed in the substrate between the at least two source fingers. The device also includes at least two gate fingers formed on a top of the substrate, wherein each gate finger is arranged between the at least one drain finger and one source finger of the at least two source fingers. The device additionally includes a substrate contact formed within the substrate and adjacent two source fingers of the at lest two source fingers.

DETAILED DESCRIPTION OF EMBODIMENTS OF THE INVENTION

In general, embodiments of the invention are directed to reducing the footprint of a FET prime cell as well as improving speed by reducing parasitic capacitance and allowing the circuit designer greater design freedom. An example of the invention includes eliminating a shallow trench isolation area from between the source and a ring substrate contact, and allowing the ring substrate contact to be arranged adjacent to or abutting the source without the need for a shallow trench isolation structure.

Figure 3:
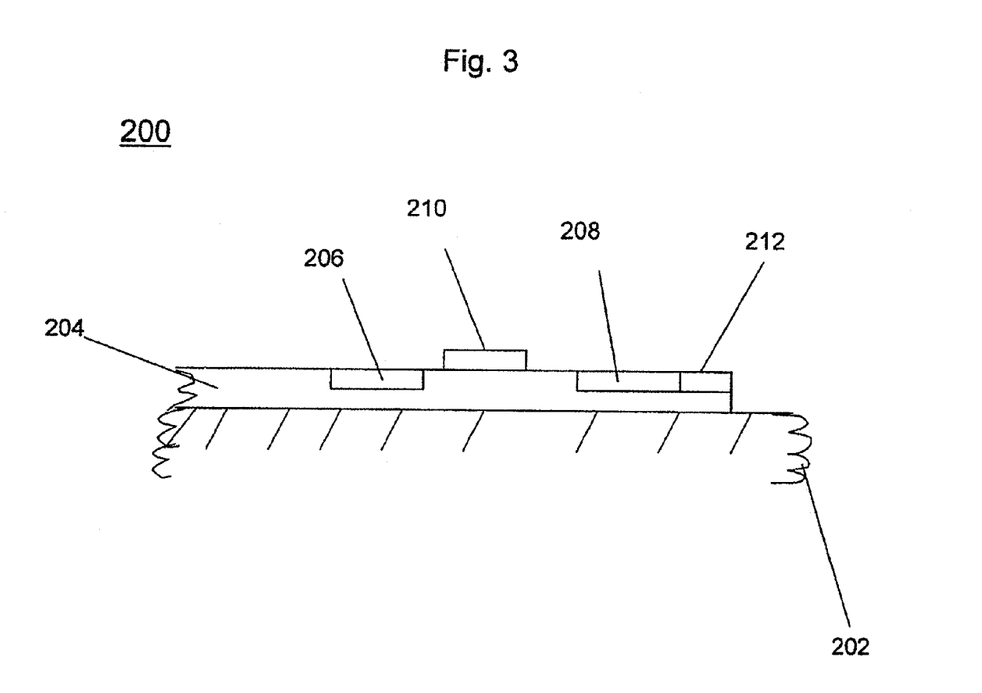
FIG. 3 is an illustration of a cross-sectional view of an embodiment of a FET prime cell in accordance with the invention.

FIG. 3 shows an embodiment 200 of the invention without a shallow isolation trench in the substrate, and includes a ring structure making contact with the source. The embodiment 200 includes a substrate 202 onto which is arranged an active region 204. Arranged within the active region 204 are a drain 206 and a source 208. The source 208 and the substrate 202 may be held at the same voltage potential. Arranged on the active region 204 is a gate 210 between the drain 206 and the source 208. Also arranged within the active region 204 is a ring substrate contact 212 (e.g., ring structure). The ring substrate contact 212 is arranged within the active region 204 adjacent to the source 208. Thus, the ring substrate contact 212 abuts or is adjacent to a side of the source 208 and is capable of being in electrical contact therewith without an intervening nonconductive structure such as a shallow trench isolation which would interfere with electrical contact between the ring structure and the source (e.g., separated by a conductive material).

In one embodiment of the invention, the ring substrate contact 212 is a p+ contact placed next to the source 208 of the FET 200. Silicide then provides an electrical contact between the source 208 and the body or active region 204 of the FET 200, such as, for example, forming a layer of silicide over a top surface of the source 208 and the body or active region 204. It should be noted that by locating the ring substrate contact 212 next to the source 208, in this fashion, it is not necessary to have a metal contact to the active region 204.

Figure 4:
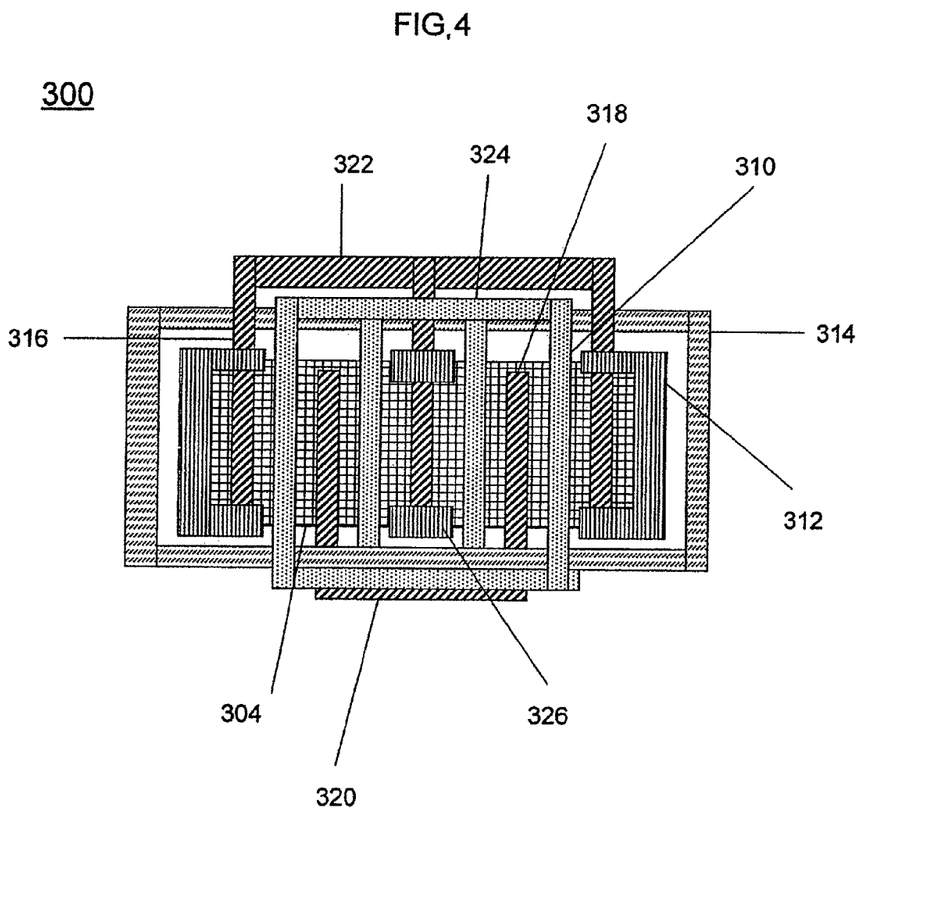
FIG. 4 is an illustration of a top view of an embodiment of a FET prime cell in accordance with the invention.

Referring to FIG. 4, a top view of another embodiment of the invention includes a FET prime cell 300. The FET prime cell 300 includes a p-well active region 304 with the elongated source contacts 316 and drain contacts 318 arranged across the surface of the active region 304 and alternating with one another. Arranged across the top of the active region 304 and between each source contact and drain contact, 316 and 318, are gate fingers 310. Accordingly, the source contacts 316, drain contacts 318 and gate fingers 310 are interleaved with one another on the surface of the active region 304. Each end of each gate finger 310 is connected to a gate bus 324. An end of each source contact 316 is connected to a source bus 322, and an end of each drain contact 318 is connected to a drain bus 320. Surrounding the active region 304 of the FET prime cell 300 is a metal ring 314.

Figure 5:
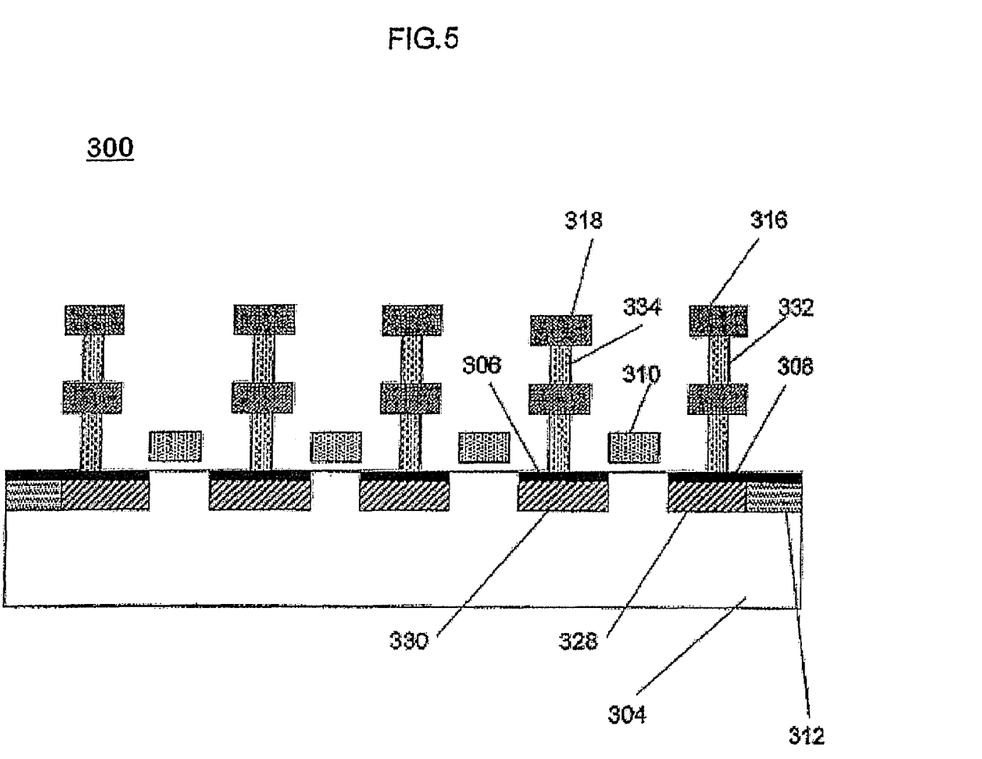
FIG. 5 is an illustration of a cross-sectional view of an embodiment of a FET prime cell in accordance with the invention.

Referring to FIG. 5, a cross-section of the FET prime cell 300 of FIG. 4 is shown. As seen in the cross-section, the FET prime cell 300 includes a p-well active region 304 into which are arranged alternating elongated drain fingers 306 and source fingers 308. Underneath each source contact 316 is the source finger 308, and underneath each drain contact 318 is the drain finger 306. Additionally, the source finger 308 and the drain finger 306 may each include metal tabs. The source contact 316 is connected to the source finger 308 with a metal connect 332, and the drain contact 318 is connected to the drain finger 306 with a metal contact 334. The drain fingers 306 and source fingers 308 include N+ wells, 330 and 328, respectively.

On top of the active region 304 and between each drain finger and source finger, 306 and 308, are the gate fingers 310. Adjacent to each outer side of each outer-most source finger 308 is a ring substrate contact or substrate contact 312 (e.g., ring structure). The ring substrate contact 312 includes a p+ region formed in the p-well 304. Also in contact with the source contact 316 in the center of the FET prime cell 300 is tab 326. Accordingly, the source fingers 308 and the ring substrate contact 312 are in electrical contact with one another and can be held at the same voltage potential.

As can be seen in FIG. 5, the ring substrate contact 312 may be adjacent to or abutting against the outer-most source finger 308 in the body or active region 304 of the FET prime cell 300. Accordingly, the ring substrate contact 312 may be placed in contact with the outer-most source finger 308, or at least in close proximity thereto with substantially no intervening non-conductive material which would interfere with electrical contact between the ring structure and the source. As such, the ring substrate contact 312 helps to keep the body or active region 304 of the FET prime cell 300 at a known voltage potential. Additionally, such a configuration of the ring substrate contact 312 relative to the outer-most source finger 308 may also act as a collection source for stray currents. Such stray currents may be produced by electrical noise, which may be induced from a nearby current source, such as, for example, another device or circuit.

It should be noted that in the examples above, the ring substrate contact may be described as completely or almost completely encircling the body or active region of a FET prime cell. Accordingly, abutting the ring substrate contact against the outer-most source finger or adjacent thereto with substantially no intervening material such as a shallow trench isolation remains beneficial regardless of whether the structure completely or incompletely encircles the active area of the FET prime cell. Thus, the ring substrate contact may extend anywhere from completely around the active region of the FET prime cell to any portion thereof, such as, for example, three-quarters of the way or half-way around the FET prime cell.

Figure 6:
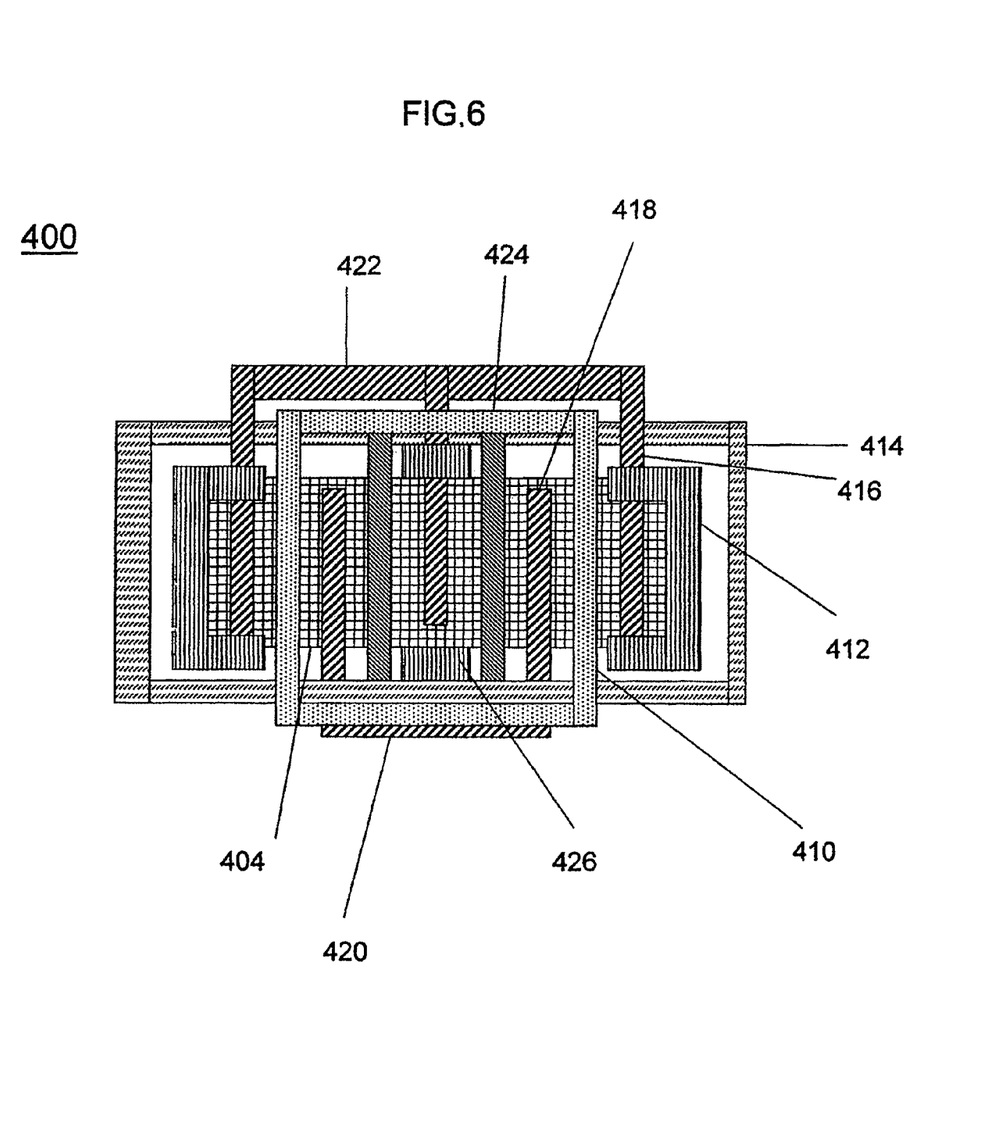
FIG. 6 is an illustration of a top view of an embodiment of a FET prime cell in accordance with the invention.

Referring to FIG. 6, a top view of an alternate embodiment of the FET prime cell 400 is shown. The FET prime cell 400 includes a body or active region 404 which has drain contacts 418 and source contacts 416 arranged thereon. The drain contacts 418 and the source contacts 416 are elongated and alternate with one another across the surface of the active region 404. Within the surface of the active region 404 underneath of the source contacts 416 are source fingers (not shown) and arranged under the drain contacts 418 in the surface of the action region 404 are drain fingers (not shown). Also arranged on the surface of the active region 404 and between the source fingers and drain fingers are gate fingers 410. The source contacts 416 are connected to one another with a source bus 422, and the gate fingers 410 are connected to one another with gate busses 424 at either end of the gate fingers 410. The drain contacts 418 are connected to one another with a drain bus 420. Arranged within the active region 404 is a ring substrate contact 412.

The ring substrate contact 412 is arranged in the active region 404 so that it is adjacent to and may abut the outer-most source fingers. Additionally, the ring substrate contact 412 may be arranged in the active region 404 of the FET prime cell 400 so that it is in close proximity to the outer-most source.

The FET prime cell 400 shown in FIG. 6 also includes a silicon tab 426 which extends from the active region 404. Accordingly, if proximity of a p+ diffusion area to the gate region and the drain region needs to be optimized, then the FET prime cell 400 incorporates the silicon tab 426 which is doped p-type for the source contact 416. Note that a similar method may also be adopted for pFETs.

As shown in the embodiments, the ring substrate contact is arranged within the active region of the FET prime cell such that it is either in close proximity to the outer-most source fingers or abuts the source fingers. Additionally, because little or no current flows through the ring substrate contact, it is not necessary to have any metal contact at the ring substrate contact. Silicide provides the electrical contact between the source and the body.

Figure 7:
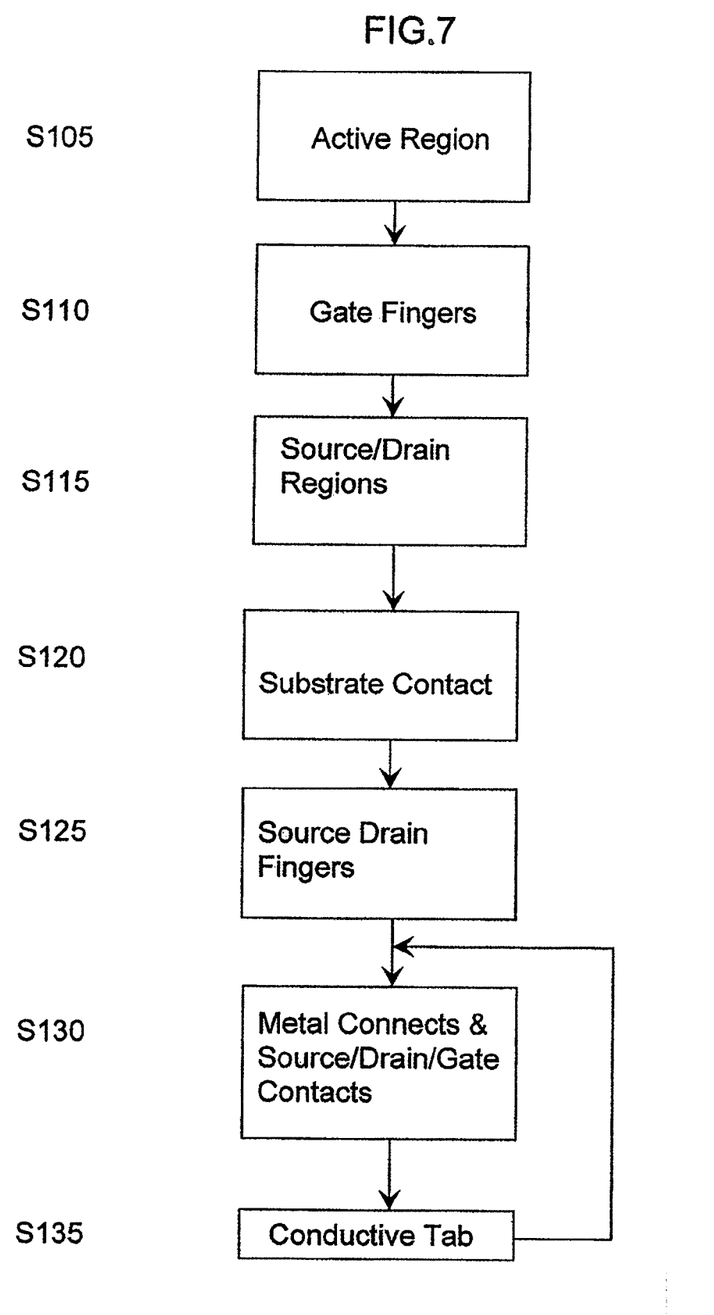
FIG. 7 is a flow chart of a method of manufacturing a FET prime cell in accordance with the invention.

A method of manufacturing a FET prime cell having a reduced footprint and improved speed, for example similar to the FET prime cell of FIGS. 3-6, may include the steps shown in FIG. 7. For example, referring to FIG. 7 in conjunction with any of the embodiments of FIGS. 3-6, a P-well active region is formed in a substrate (S105). The P-well active regions may be formed by any of the suitable doping methods well known in the art.

Gate fingers are next formed on the substrate (S 110). The gate fingers may be formed by any of the deposition, imaging and etching methods well known in the art for gate formation. The gates are used as a mask while source/drain regions are formed having N+ wells by any of the doping methods well know in the art for forming source/drain regions (S115). A substrate contact is formed around the active region (S120). The substrate contact may be formed from a conductor such as a metal and may formed using any of the methods well known in the art for forming such a conductor in the substrate.

Fingers are formed on each of the source/drain regions (S125). Metal connects are attached to the source/drain regions and source/drain contacts are formed in contact with the metal connects (S130). A conductive tab may be formed in electrical contact with the source contact near the center of the prime FET cell (S135) in one embodiment, having metal connects and source/drain contacts formed thereto, as well (repeat S130). Accordingly, an FET prime cell having a substrate contact is formed.

While the invention has been described in terms of exemplary embodiments, those skilled in the art will recognize that the invention can be practiced with the modifications and in the spirit and scope of the intended claims.

What is claimed:

1. A semiconductor device, comprising:
   a source and a drain arranged within a substrate;
   a gate formed on the substrate between the source and drain;
   a substrate contact formed within the substrate in electrical contact with the source, a bottom surface of the substrate contact being arranged over a portion of the semiconductor material of the substrate and the substrate contact being arranged adjacent to a side of the source without an intervening shallow trench isolation structure; and
   a metal ring surrounding an active region of the semiconductor device,
   wherein little or no current flows through the substrate contact,
   wherein the substrate contact helps to keep an active region of the semiconductor device at a voltage potential and acts as a collection source for stray currents, and
   wherein the drain comprises at least one drain finger extending beyond the metal ring.

2. The semiconductor device of claim 1, further comprising the substrate contact being configured to shield the semiconductor device from electrical noise.

3. The semiconductor device of claim 1, further comprising the substrate contact being in direct physical contact with the source of the semiconductor device.

4. The semiconductor device of claim 1, wherein the substrate contact comprises a p+ region.

5. The semiconductor device of claim 1, wherein the source comprises a source finger and the substrate contact abuts substantially all of one side of the source finger.

6. The semiconductor device of claim 1, wherein the source comprises at least two source fingers arranged within the substrate, wherein the substrate contact abuts two of the at least two source fingers.

7. The semiconductor device of claim 1, wherein the substrate contact comprises a p-type doped silicon tab contacting the source and a silicide layer arranged on top of the substrate contact.

8. The semiconductor device of claim 1, wherein the substrate contact at least one of:
   completely encircles an active region;
   almost completely encircles an active region;
   encircles three-quarters of an active region; and
   encircles half of an active region.

9. The semiconductor device of claim 1, wherein the semiconductor device comprises an FET prime cell.

10. A semiconductor device, comprising:
    a substrate made of semiconductor material;
    a source and a drain arranged within the substrate;
    a gate formed on the substrate between the source and the drain; and
    a ring substrate contact formed within the substrate in electrical contact with the source and a bottom surface of the ring substrate contact being arranged over a portion of the semiconductor material of the substrate; and
    wherein the ring substrate contact one of:
      abuts a side of the source without an intervening shallow trench isolation structure, and
      is arranged adjacent to the side of the source without an intervening shallow trench isolation structure, and
    wherein the ring substrate contact helps to keep an active region of the semiconductor device at a voltage potential and acts as a collection source for stray currents.

11. The semiconductor device of claim 10, wherein the ring substrate contact is configured to shield the semiconductor device from electrical noise.

12. The semiconductor device of claim 10, wherein the ring substrate contact is in direct physical contact with the source of the semiconductor device.

13. The semiconductor device of claim 10, further comprising a metal ring surrounding an active region of the semiconductor device and the drain comprises at least one drain finger extending beyond the metal ring.

14. The semiconductor device of claim 10, wherein the source comprises a source finger and the ring substrate contact abuts substantially all of one side of the source finger.

15. The semiconductor device of claim 10, wherein the source comprises at least two source fingers arranged within the substrate, wherein the ring substrate contact abuts two of the at least two source fingers.

16. The semiconductor device of claim 10, wherein the ring substrate contact comprises a p-type doped silicon tab contacting the source and further comprising a silicide layer arranged on top of the ring substrate contact.

17. The semiconductor device of claim 10, wherein the semiconductor device comprises an FET prime cell.

18. The semiconductor device of claim 10, wherein the ring substrate contact at least one of:
    completely encircles an active region;
    almost completely encircles an active region;
    encircles three-quarters of an active region; and
    encircles half of an active region.

19. A semiconductor device, comprising:
    interleaved source and drain regions in a substrate;
    a gate on the substrate between each respective source and drain of the interleaved source and drain regions;

a substrate contact in direct contact with an outermost source of the interleaved source and drain regions, which provides a collection source configured for shielding electrical noise external to an active region of the substrate; and an electrical contact to the source, drain and gate, and the substrate, wherein the substrate contact is formed as a partial ring with a tab in contact with a source contact of an inner source of the interleaved source and drain regions.

20. The semiconductor device of claim 19, wherein:

the substrate contact is in electrical contact with the outermost source;

the substrate contact is laterally adjacent to the outermost source and abuts an outermost side of the outermost source; and a metal ring entirely surrounds the active region, the substrate contact, and the tab.

* * * * *